United States Patent [19]

Schneider

[11] Patent Number: 5,495,130
[45] Date of Patent: Feb. 27, 1996

[54] POINT LEVEL SWITCH

[75] Inventor: Quentin L. Schneider, Downers Grove, Ill.

[73] Assignee: Magnetrol International, Incorporated, Downers Grove, Ill.

[21] Appl. No.: 578,792

[22] Filed: Sep. 4, 1990

[51] Int. Cl.⁶ .................................................. H01H 35/00
[52] U.S. Cl. ........................ 307/118; 73/304 C; 324/674; 324/688
[58] Field of Search ................................. 307/118, 116, 307/308; 361/117, 129, 178, 181, 212, 220, 280, 284, 282; 340/618, 620; 73/304 C; 137/392; 324/667, 670, 674, 678, 683, 685, 688

[56] References Cited

U.S. PATENT DOCUMENTS

| | | | |
|---|---|---|---|
| 3,676,742 | 7/1972 | Russell et al. | 361/56 |
| 3,684,952 | 8/1972 | Lundstrom | 324/667 |
| 3,684,953 | 8/1972 | Grant | 324/688 |
| 3,742,347 | 6/1973 | Walton | 324/685 X |
| 3,774,237 | 11/1973 | Hardway, Jr. | 324/672 |
| 3,864,626 | 2/1975 | MacLean et al. | 324/672 |
| 3,879,660 | 4/1975 | Piso | 324/671 |
| 3,896,374 | 7/1975 | Delafon | 324/683 |
| 4,058,765 | 11/1977 | Richardson et al. | 324/669 |
| 4,173,398 | 11/1979 | Hedrick | 73/304 C |
| 4,199,984 | 4/1980 | Huddart et al. | 73/304 C |
| 4,310,794 | 1/1982 | Maier | 324/669 |
| 4,470,008 | 9/1984 | Kato | 324/683 |
| 4,499,766 | 2/1985 | Fathauer et al. | 73/304 C |
| 4,499,767 | 2/1985 | Fathauer et al. | 73/304 C |
| 4,530,372 | 7/1985 | Overton et al. | 137/392 |
| 4,532,419 | 7/1985 | Takeda | 235/492 |
| 4,551,785 | 11/1985 | Kroner | 361/284 |
| 4,555,941 | 12/1985 | Fathauer et al. | 73/304 C |
| 4,676,100 | 6/1987 | Eichberger | 73/304 C |
| 4,780,705 | 10/1988 | Beanne | 340/620 |
| 4,788,488 | 11/1988 | Kramer et al. | 324/669 |
| 4,800,755 | 1/1989 | Fathauer et al. | 73/304 C |
| 4,809,129 | 2/1989 | Hansen, III et al. | 361/284 |
| 4,853,718 | 8/1989 | ElHatem et al. | 324/672 |
| 4,881,025 | 11/1989 | Gregory | 324/672 |
| 5,017,909 | 5/1991 | Goekler | 340/620 |

*Primary Examiner*—Jeffrey A. Gaffin
*Attorney, Agent, or Firm*—Wood, Phillips, VanSanten, Clark & Mortimer

[57] ABSTRACT

A capacitance point level switch includes a probe adapted to be disposed in a material containing vessel, the material having a capacitance value dependent upon its level in the vessel. An oscillator circuit develops a periodic signal at a select frequency. A reference network is driven by the oscillator and includes a reference capacitance for developing a periodic reference signal at the select frequency and phase displaced responsive to the reference capacitance. A probe network is driven by the oscillator and is connected to the probe to include the capacitance of the material for developing a periodic probe signal at the select frequency and phase displaced responsive to capacitance of the material. An output circuit is connected to the reference network and the probe network for developing a discrete output assuming a first or a second state according to the relative phase displacement of the periodic reference signal and the periodic probe signal.

15 Claims, 4 Drawing Sheets

1

POINT LEVEL SWITCH

FIELD OF THE INVENTION

This invention relates to level sensing instruments and, more particularly, to a capacitance-type point level switch.

BACKGROUND OF THE INVENTION

Various instruments have found use for applications requiring level sensing, particularly sensing of discrete levels of, for example, a liquid or bulk material in a vessel. Such instruments include float level switches, ultrasonic level switches and capacitance point level switches. With any such instrument it is desirable that the instrument be adaptable to a plurality of different types of materials, and provide reliable, repeatable measurements.

With a capacitance-type level sensor, the instrument includes a circuit connected to a probe adapted to be disposed in a material containing vessel. Such a material acts as a dielectric. Assuming that the vessel is conductive, a capacitance is present between the probe and the vessel, or an alternative reference, which such capacitance represents level in the vessel.

A capacitance point level switch is operable to sense a specific level of the material in the vessel and provide a discrete output, such as with a relay contact, when the material is at a sufficient level to cause the capacitance between the probe and the reference to exceed a reference value. It is desirable that the circuit have the ability to detect minute changes in capacitance to provide a precise measurement.

The present invention is intended to satisfy the above requirements.

SUMMARY OF THE INVENTION

In accordance with the present invention, a capacitance point level switch is provided which senses minute changes in capacitance.

Broadly, there is disclosed herein a capacitance point level switch including a probe adapted to be disposed in a material containing vessel, the material having a capacitance value dependent upon its level in the vessel. An oscillator circuit develops a periodic signal at a select frequency. A reference network is driven by the oscillator and includes a reference capacitance for developing a periodic reference signal at the select frequency and phase displaced responsive to the reference capacitance. A probe network is driven by the oscillator and is connected to the probe to include the capacitance of the material for developing a periodic probe signal at the select frequency and phase displaced responsive to capacitance of the material. An output circuit is connected to the reference network and the probe network for developing a discrete output assuming a first or a second state according to the relative phase displacement of the periodic reference signal and the periodic probe signal.

It is a feature of the invention that the select frequency varies as a function of the reference capacitance and the material capacitance.

It is another feature of the invention that the oscillator circuit develops a square wave signal.

It is a further feature of the invention that the network comprises an RC circuit driven by the oscillator circuit for developing a sawtooth-type waveform.

It is still another feature of the invention That the RC circuits utilize a common potentiometer and the potentiometer is adjustable to calibrate the networks to select a desired material level at which the discrete output changes state.

It is still a further feature of the invention wherein each network further comprises a comparator connected to is associated RC circuit for comparing the sawtooth-type waveform to a reference to develop a square wave output at a select frequency and phase displaced responsive to its associated capacitance.

In accordance with a further aspect of the invention, the level switch includes a latching circuit connected to the output circuit and the reference network including means for varying resistance of the reference network RC circuit according to the state of the discrete output.

It is yet an additional feature of the invention wherein the output circuit includes means for determining which of the phase displaced signals leads the other.

It is yet an additional feature of the invention that the output circuit includes a flip-flop circuit connected to the network circuits.

It is still yet another feature of the invention that the output circuit includes means for delaying when the discrete output switches from the first state to the second state.

It is still yet a further feature of the invention that the output circuit includes means for delaying when the discrete output switches from the second state to the first state.

In accordance with another aspect of the invention the output circuit includes first means for delaying when the discrete output switches from the first state to the second state, a second means for delaying when the discrete output switches from the second state to the first state, and selection means for selectively switching the first and second means into and out of operation in the output circuit.

It is still a further feature of the invention that the output circuit includes an anti-bounce circuit for preventing cycling of the discrete output.

It is still a further feature of the invention to provide a protection circuit connected to the probe network including means for compensating the probe network for temperature changes.

It is disclosed herein in accordance with a further aspect of the invention a capacitance point level switch including a probe adapted to be disposed in a material containing vessel, the material having a capacitance value dependent on its level in the vessel. A network includes the capacitance of the material for determining if the level of the material is above a select level responsive to the capacitance of the material. A relay drive circuit includes an output relay connected to the network for assuming a first or a second state according to the material level being above or below the select level. A power supply circuit includes an unregulated supply for powering the output relay, a regulated supply including an input capacitor for powering the network, and a diode connecting the regulated supply to the unregulated supply to prevent discharge of the input capacitor during relay load changes.

It is a feature of the invention that the diode includes an anode connected to the unregulated supply and a cathode connected to the regulated supply to power the same.

It is a further feature of the invention that the probe comprises a guarded probe and further comprising a guard drive circuit to drive a probe guard so that potential between the probe and the guard is zero.

It is still another feature of the invention that the probe guard is powered by an unregulated supply connected to the cathode of the diode.

Further features and advantages of the invention will readily be apparent from the specification and from the drawings.

DESCRIPTION OF THE INVENTION

Figure 1:
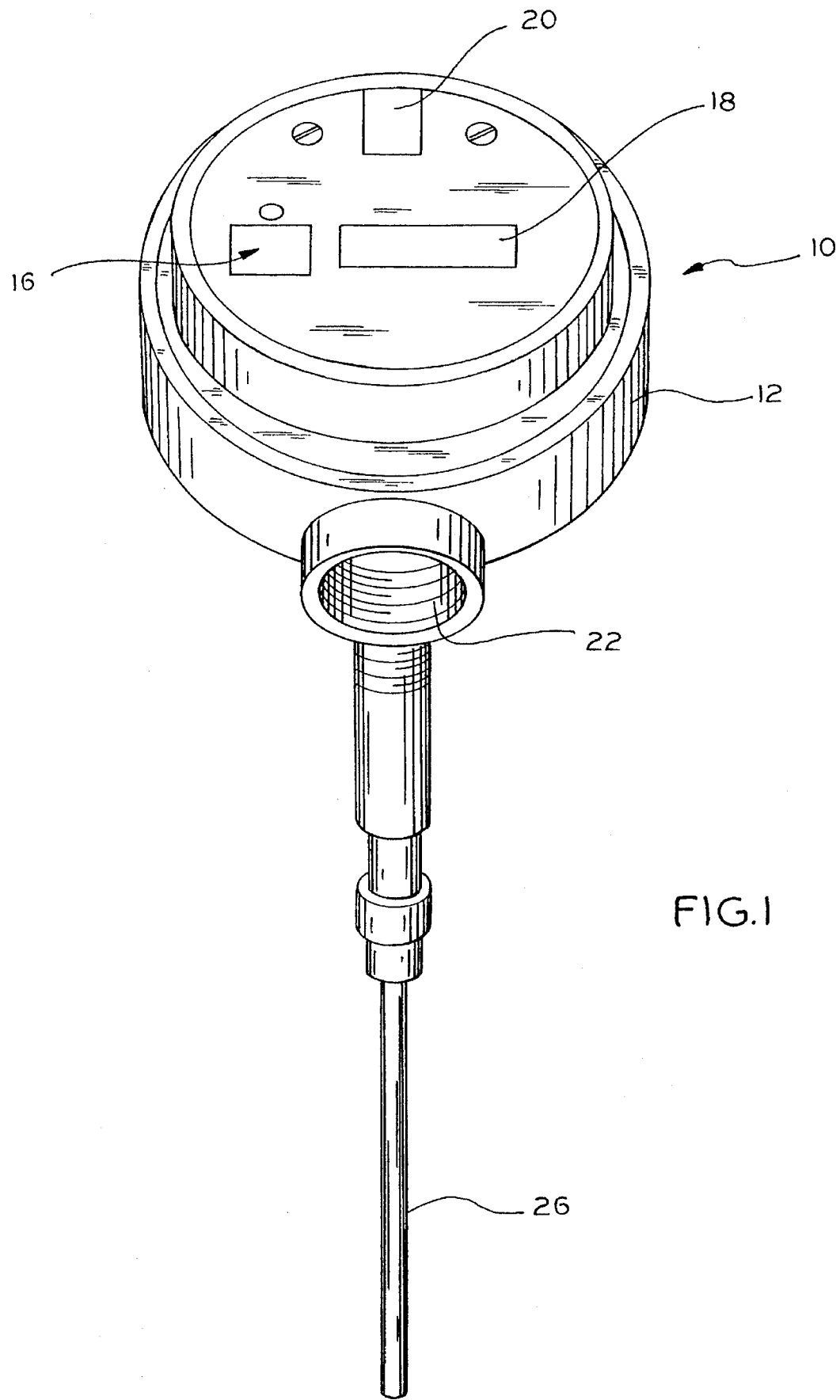
FIG. 1 is a perspective view of a capacitance point level switch according to the invention.

With reference to FIG. 1, there is illustrated in perspective view a capacitance point level switch 10 according to the invention. The switch 10 includes a housing base 12, configured to accept a cover 14, see FIG. 2, for enclosing a circuit board 16, terminal block 18, and a jumper selection board 20, all described more specifically below. A threaded female connection 22 is provided for connecting to a conduit 24, see FIG. 2, for carrying electrical conductors for connecting to external circuitry.

Threadably connected to the housing base 12 using suitable insulation materials is a probe 26. In accordance with the illustrated embodiment of the invention, the probe 26 comprises a guarded probe including a probe electrode and a guard shield, as is well known.

Figure 2:
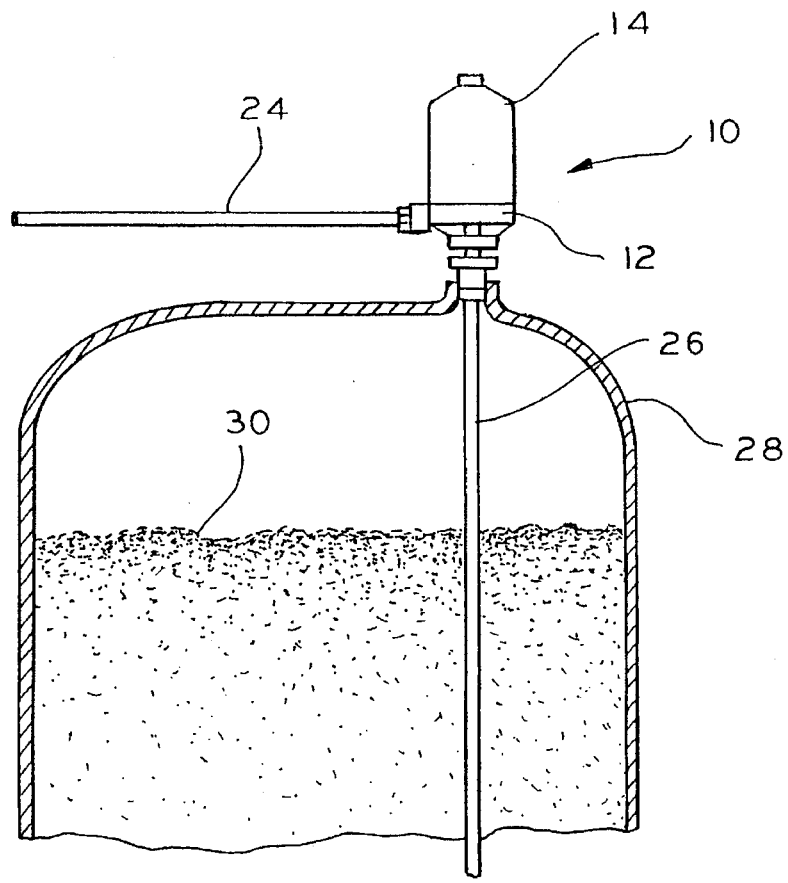
FIG. 2 is a side view of the switch of FIG. 1 mounted to a material containing vessel.

With reference to FIG. 2, the switch 10 is adapted to be mounted to a vessel 28 containing a material 30, the level of which is to be sensed. The material 30 acts as a dielectric with the capacitance between the probe 26 and vessel 28 varying as a function of the level of the material 30.

In accordance with the invention, the switch 10 is operable to sense a discrete level of the material 30 in the vessel 28 by using a circuit responsive to capacitance of the material 30, as discussed below.

Figure 3:
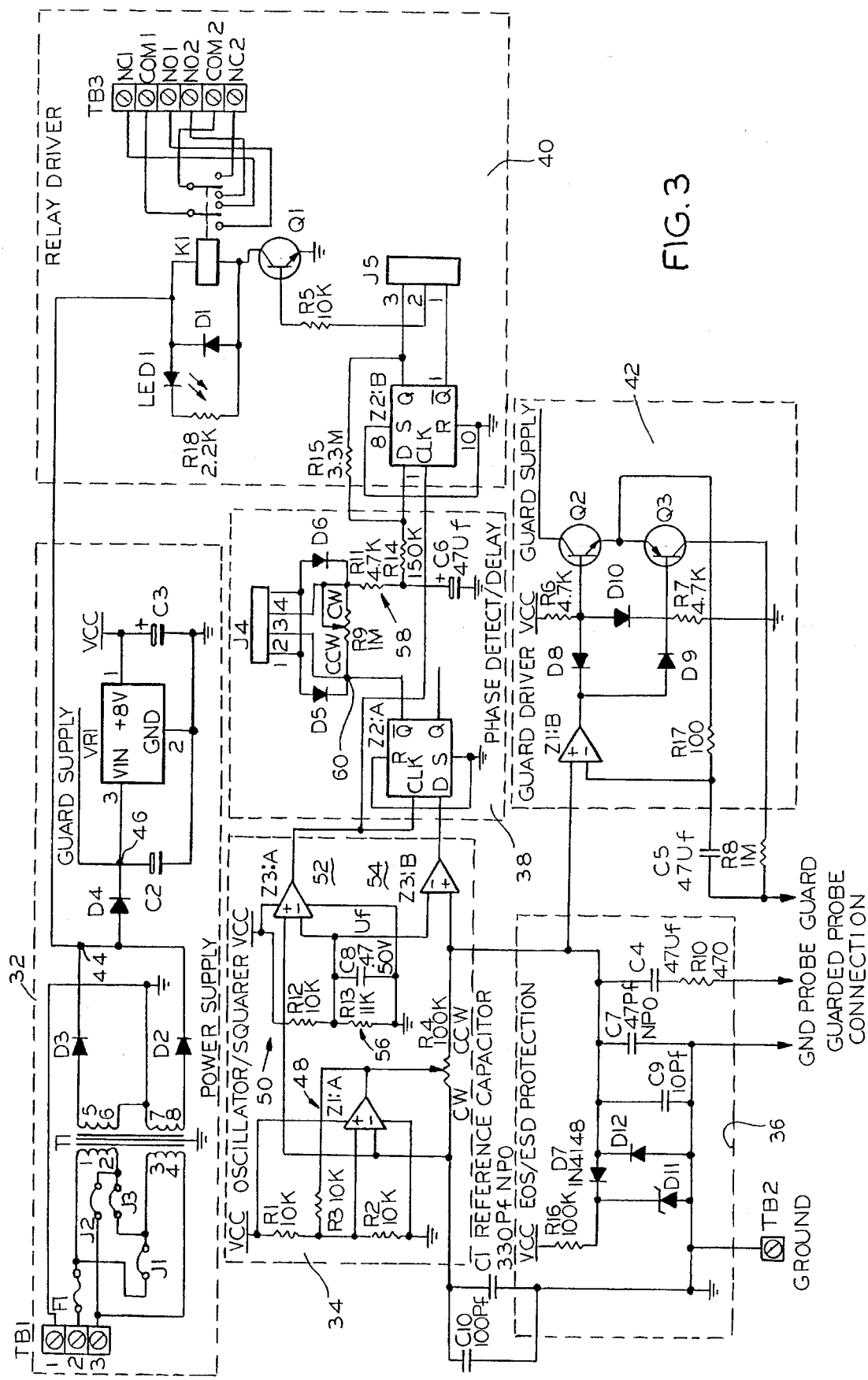
FIG. 3 is an electrical schematic diagram illustrating a circuit for the switch of FIG. 1.

With reference to FIG. 3, a schematic diagram illustrates a circuit utilized on the circuit board 16 of FIG. 1. Particularly, the circuit board 16 includes a power supply circuit 32, an oscillator/squarer circuit 34, a protection circuit 36, a phase detect/delay circuit 38, a relay driver circuit 40 and a guard driver circuit 42.

The power supply circuit 32 is operable to convert AC input power at terminal block TB1 to DC power at select levels for powering the remaining circuits. The terminal block TB1 is connected through suitable jumpers J1–J3 used to select between 120 volt or 240 volt AC input power to the primary side of a transformer T1. The transformer T1 steps down the input voltage to approximately 14 volts AC which is connected through a full-wave rectifier circuit comprising diodes D2 and D3 to provide DC power at about 16 volts at a node 44. The node 44 is connected to deliver unfiltered power to energize a relay K1 of the relay driver circuit 40, as discussed below. The node 44 is also connected to the anode of a diode D4 having its cathode connected to a node 46. A capacitor C2 is connected between the node 46 and ground to provide filtering. The diode D4 serves to protect the filter capacitor C2 from discharge when the relay K1 loads the supply 32. A voltage regulator VR1 of conventional construction is connected to the node 46 and ground and delivers regulated power at approximately 8 volts at a supply point labelled VCC which is connected through a capacitor C3 to ground.

The oscillator/squarer circuit 34 comprises an oscillator circuit 48, and a network 50 driven by the oscillator circuit 48 and comprising a reference network 52 and a probe network 54.

The oscillator circuit 48 is powered by the regulated supply VCC and includes an operational amplifier Z1:A having its input connected across a voltage divider and feedback circuit comprising resistors R1–R3. An output of the operational amplifier Z1:A is connected to the wiper of a potentiometer R4. One side of the potentiometer R4 is connected to a reference capacitor C1.

The operational amplifier Z1:A, together with the resistors R1, R2, R3 and potentiometer R4, and the reference capacitor C1, form a phase-shift oscillator. Ignoring effects of other circuitry, at power-up the reference capacitor C1 has no stored charge and therefore no voltage across it. With the inverted input of the OP AMP Z1:A at ground, and the non-inverted input at a positive potential, the output assumes supply level. Because the OP AMP Z1:A is a CMOS device, the output will closely approach 8 volts DC. The voltage at the non-inverted input, as determined by the resistor network of resistors R1, R2 and R3 will be at $2/3$ of supply voltage, namely, 5.33 volts. As the reference capacitor C1 charges through R4 toward 8 volts, it eventually increases the inverted input of the OP AMP Z1:A to a value more positive than that at the non-inverted input. At such time, the output falls to the negative rail and the potential at the non-inverted input will be $1/3$ of supply, namely 2.67 volts. The reference capacitor C1 then discharges through the potentiometer R4 until the voltage at the inverted input goes below the voltage at the non-inverted input at which point the cycle restarts.

In addition to the reference capacitor C1, the capacitance sensed by the probe 26, see FIG. 1, also loads the potentiometer R4. More particularly, the probe is connected in series with a resistor R10 and capacitor C4 to the opposite side of the resistor R4. Thus, the oscillator circuit 48 develops a square wave output at a frequency determined by the resistance of the potentiometer R4, the reference capacitor C1, and the probe capacitance. This select frequency varies as a function of the reference capacitance and the sensed capacitance of the material.

The reference network 52 includes an OP AMP Z3:A having a non-inverted input connected to the junction between the reference capacitor C1 and the potentiometer R4. The probe network 54 includes an OPAMP Z3:B having a non-inverted input connected to the junction between the potentiometer R4 and the series connection including the probe 26. The inverted input of the OPAMP Z3:A and Z3:B are connected to a circuit 56 configured to provide a DC level slightly higher than half of the supply voltage.

The signals present at the non-inverted inputs of the OP AMP Z3:A and Z3:B comprise sawtooth type waveforms at the select frequency determined by the oscillator circuit 48, as discussed above. The two signals differ only in phase and amplitude. More particularly, the square wave signal developed by the oscillator 48 drives the respective RC circuit of the networks 52 and 54 to provide the sawtooth type waveforms wherein the rise time and fall time of the sawtooth during each period are determined in accordance with the RC time constant. The sawtooth oscillates between the ⅓ and ⅔ supply values generated by the oscillator circuit 48. The OP AMPs Z3:A and Z3:B act as comparators which respond to the sawtooth waveforms climbing relative to the arbitrary input value at the inverted inputs thereof to provide square wave output signals phase displaced according to the relative phase displacement of the reference sawtooth waveform and the probe sawtooth waveform, respectively. As is apparent, if one of the circuits has a lower RC value, then its sawtooth climbs at a faster rate to provide a phase displaced signal that leads the other. For example, if the probe RC value is less than the reference RC value, then the voltage climbs faster at the non-inverted input of the OP AMP Z3:B than at the OP AMP Z3:A, to provide a square wave signal having a pulse transition that leads the other. Conversely, if the reference RC is less than the probe RC, then the OP AMP Z3:A will have a square wave output leading that of the OP AMP Z3:B.

The phase detect/delay circuit 38 includes a D-type flip-flop Z2:A having its clock driven by the OP AMP Z3:A and its data input connected to the output of the OP AMP Z3:B. The flip-flop Z2:A transfers from the D input to the Q output on the rising edge of the clock waveform. Thus, if the D input goes high before the clock, then the Q output will be high until the next clock pulse. Conversely, if the D input goes high after the clock, then the Q output will be low until the next clock pulse. In the illustrated embodiment, the inverted output $\bar{Q}$ provides a discrete output representative of which of the two square wave signals leads the other to indicate if the level of material 30 is above or below a select level. Continuing the above-discussed examples, if the probe RC is less than the reference RC, then the D input to the flip-flop Z2:A goes high before the clock so that the output $\bar{Q}$ is low, representative of the level being below the select level. Conversely, if the probe RC is greater than the reference RC, such as when the level is above the select level, then the clocking signal occurs before the rising edge of the D wave form so that the output $\bar{Q}$ is high, as expected. It should be noted that if the probe connection is shorted to ground, such as with a large probe capacitance, then the DC voltage at the non-inverted input of the OP AMP Z3:B will go to ½ supply and the D input to the flip-flop Z2:A will go to ground.

The precision of the phase comparison as accomplished by the OP AMP Z3:A and Z3:B and the flip-flop Z2:A is of the same order of magnitude as the rise-time of the pulse, i.e. approximately twenty-five nanoseconds out of the period of the driving waveform of thirty microseconds.

As is known, the capacitance sensed by the probe 26 varies with the type of material to be sensed, in addition to other factors. To compensate for such variations, the potentiometer R4 is adjusted to provide balance between the capacitance of the reference capacitor C1 and the capacitance provided by the capacitor C4 and the capacitance sensed at the probe 26. The potentiometer R4 can also be adjusted to select the level to be sensed.

The phase detect/delay circuit 38 further includes an anti-bounce circuit comprising a resistor R14 and a capacitor C6 to prevent cycling of the output. A delay circuit 58 also serves to average the data from the flip-flop Z2:A over an arbitrary period determined by the setting of a potentiometer R9. This also provides stability to prevent cycling of the output.

The delay circuit 58 includes a node 60 connected to the $\bar{Q}$ output of the flip-flop Z2:A. The node 60 is also connected to the cathode of a diode D5, and to one side of the potentiometer R9 and to pin 2 of the four-pin jumper block 20, see FIG. 1. The anode of the diode D5 is connected to pins 1 and 4 of the jumper block 20. A node 62 is connected to the cathode of a diode D6, and to the other side of the potentiometer R9 and the potentiometer wiper, as well as a pin 3 of the jumper block 20. The anode of the diode D6 is connected to pins 1 and 4 of the jumper block 20. The node 62 is also connected to a series resistor R11 and the capacitor C6 to ground. The resistor R14 is connected to the junction between the resistor R11 and the capacitor C6 and provides an output indicating the status of level in the tank.

The jumper block 20 is used to set the characteristics of the network to delay while charging, delay while discharging, delay while both charging and discharging, or to switch without delay, dependent on its position. Particularly, if pins one and two are shorted, then output from the flip-flop Z2:A is routed through the resistance of the potentiometer R9 to provide delay on emptying the tank. If a jumper is provided between pins two and three, then the potentiometer R9 is effectively bypassed to provide no delay. If a jumper is provided between pins three and four, then the circuit provides a time delay on filling the tank. If no connection is provided in the jumper block, then delay is provided both on emptying and filling the vessel.

The relay driver circuit 40 includes a second D flip-flop Z2:B having its D input connected to the resistor R14 of the phase detect/delay circuit 38. The flip-flop Z2:B is clocked by the same signal as the flip-flop Z2:A. If a high level is presented to the D input, then the output will reflect the input at the rising edge of the subsequent clock pulse. A resistor R15 across the Q output and the D input tends to pull the D input toward the Q output. The resistors R14 and R15 form a feedback network which tend to latch the output of the flip-flop Z2:B and thus to present a Schmitt trigger-type hysteresis.

A jumper J5 permits selection of the Q or $\bar{Q}$ output to drive the base of a transistor Q1 into conduction to select a fail-safe high or fail-safe low mode of operation by connecting either pin one or pin three, respectively, to pin two, which is connected via a resistor R5 to the base of the transistor Q1. The collector of the transistor Q1 is connected to one side of the relay K1, the other side being connected to the power supply, as discussed above. When the transistor Q1 conducts, collector current energizes the relay K1 and illuminates an LED1 through a resistor R18 connected in parallel with the relay K1. A diode D1 is also connected across the relay K1 and protects the transistor Q1 from the turnoff transient voltage produced by inductance in the coil of the relay K1.

The relay K1 includes two pairs of normally open and normally closed contacts connected to a terminal block TB3 for connection to external devices to provide indication as to material level in the vessel being above or below the select level.

The protection circuit 36 provides various protection functions and stabilizing functions for the various circuit components. For example, temperature variations may exist in operation of the component parts. Also, material dielectric constant may change owing to variations in substance of a material. However, it is desirable to maintain absolute stability in operation of the point level switch 10.

A capacitor C7 is connected between the non-inverted input of the OP AMP Z3:B and the ground or reference point, i.e. the vessel, and acts to preload the oscillator circuit 48 to assure operation at any adjustment of the potentiometer R4. Capacitor C9, in parallel with the capacitor C7, or capacitor C10, in parallel with the reference capacitor C1, are used to compensate for temperature effects on circuit sensitivity. Particularly, the capacitor C9 biases the negative coefficient towards the probe, while the capacitor C10 biases the negative coefficient towards the reference capacitance. If it is desired to do both, then both capacitors C9 and C10 are used.

A diode D12 across the capacitor C7, and a diode D7 in the rail to the supply, serve to clamp the probe voltage between ground and supply to limit unexpected input transients. A zener diode D11 across the diode D12, and the opposite side of the diode D7, and a resistor R16 to the supply, establish a voltage reference at relatively low impedance. The capacitor C4 isolates the probe driver circuit from the probe, as far as DC voltage is concerned. A resistor R10 limits the maximum fault current flowing from the probe into the circuit.

The probe 26 may take any known form. In the illustrated embodiment of the invention, the probe 26 comprises a guarded probe of any known construction including a probe element discussed above, and a guard shield insulated from the probe. It is necessary to drive the probe guard shield such that the potential between the probe and the guard is always made equal to zero. Such function is performed by the guard driver circuit 42.

The guard driver circuit 42 includes an operational amplifier Z1:B having a non-inverted input connected to the probe element opposite the capacitor C4, while the inverted input is connected through a capacitor C5 to the guard shield. The OP AMP Z1:B, together with diodes D8, D9, D10, resistors R6 and R7, and transistors Q2 and Q3 form a unity gain power amplifier which drive the guard shield so that the potential between the probe element and the guard shield is always made equal to zero. A resistor R7 is connected between the base of the transistor Q3 and ground to feed back the driver output to limit maximum drive current and to set the gain of the amplifier. The capacitor C5 blocks DC voltage from the drive circuit while a resistor R8 connected between the guard shield and ground bleeds charge from the guard shield. The transistors Q2 and Q3 are driven by the filtered, but unregulated, supply of the power supply 32 as by connection to the node 46.

Thus, in accordance with the invention, the level switch 10 utilizes an oscillator circuit 48 developing a periodic square wave signal at a select frequency. A reference network 52 is driven by the oscillator circuit 48 and includes a reference capacitance C1 for developing a periodic sawtooth-type wave signal at the select frequency and phase displaced responsive to the reference capacitance. The probe network 54 is driven by the oscillator circuit 48 and is connected to the probe 26 to include the capacitance of the material 30 for developing a periodic probe sawtooth-type waveform signal at the select frequency and phase displaced responsive to capacitance of the material 30. An output circuit in the form of the phase detect/delay circuit 38 and the relay driver 40 are connected to the reference network 52 and the probe network 54 for developing a discrete output which assumes a first or a second state according to the relative phase displacement of the reference sawtooth waveform signal and the probe sawtooth waveform signal.

Figure 4:
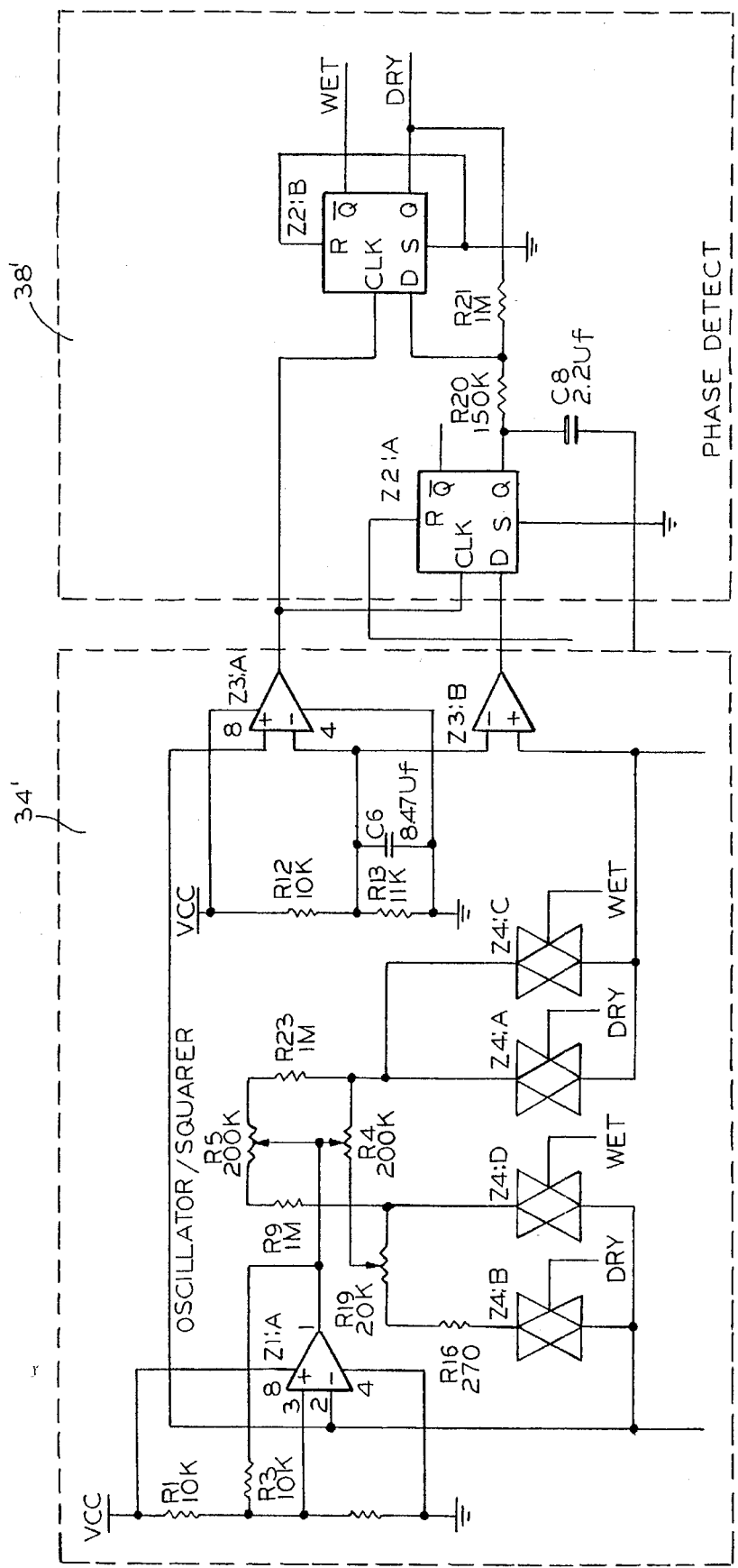
FIG. 4 is a partial schematic diagram similar to a portion of that of FIG. 2 illustrating an oscillator/squarer circuit and phase detect circuit according to an alternative embodiment of the invention.

With reference to FIG. 4, a schematic diagram illustrates an oscillator/squarer circuit 34' and a phase detect circuit 38' in accordance with an alternative embodiment of the invention. These circuits 34' and 38' may be substituted for similar portions of the circuit of FIG. 3, all other portions remaining generally the same, as would be obvious to one skilled in the art, and is operable to latch the probe detection with adjustable hysteresis.

For simplicity herein, like elements relative to the embodiment of FIG. 3 are referenced with like reference numerals and therefore will not be discussed in detail herein.

The oscillator circuit 48', in addition to the elements discussed above relative to FIG. 3, includes a second potentiometer R5 connected in parallel with the potentiometer R4 via resistors R23 and R24. The potentiometer R4 acts as a course balance adjustment, while the potentiometer R5 acts as a fine balance adjustment. Interposed between the one side of the potentiometer R4 and the non-inverted input of the OP AMP Z3:B are a pair of switches Z4:A and Z4:C from a quad bilateral switch, such as a type 4066 integrated circuit. Specifically, this circuit comprises four switches, A–D, the state of which are driven by the status of signal inputs for each switch. The opposite side of the potentiometer R4 is connected to the potentiometer R19 having its opposite sides connected through the remaining two switches Z4:B and Z4:D of the 4066 switch to the reference network 52'.

In the alternative embodiment illustrated, the phase detect circuit 38' is shown without the delay circuit, and the D flip-flop Z2:A is instead connected directly to the D flip-flop Z2:B via resistors R20 and R21. The second D flip-flop Z2:B uses its Q output to indicate a dry condition, and its $\overline{Q}$ output to indicate a wet condition of the probe. These wet and dry conditions are used to drive the switches Z4:A–Z4:D. Specifically, the Q output of the second flip-flop Z2:B drives the switches Z4:D and Z4:C, while the $\overline{Q}$ output drives the switches Z4:A and Z4:B. The $\overline{Q}$ output is further used to drive the relay driver circuit (not shown) similar to above.

In operation, when the dry signal is high, then the switches D and C for the analog switch Z4 are open, and the switches A and B are closed to switch the potentiometer R19 into the circuit and the reference is determined in accordance with the combination of the potentiometer R4 and the potentiometer R19. Once the select level is reached and the probe becomes wet, i.e. the probe capacitance increases above the select level, then the wet output goes high and the dry output goes low causing the switches A and B of the analog switch Z4 to open, and the switches D and C to close, removing the potentiometer R19 from the oscillator circuit 48'. This decreases the time constant of the reference circuit so that the probe capacitance must decrease a greater amount prior to switching back to the dry condition and the first flip-flop Z2:A thus latches into the wet condition.

Thus, in accordance with the alternative embodiment of the invention, the level detection is provided with a latching circuit with adjustable hysteresis, the resistance of the potentiometer R19 being varied to adjust hysteresis.

Figure 5:
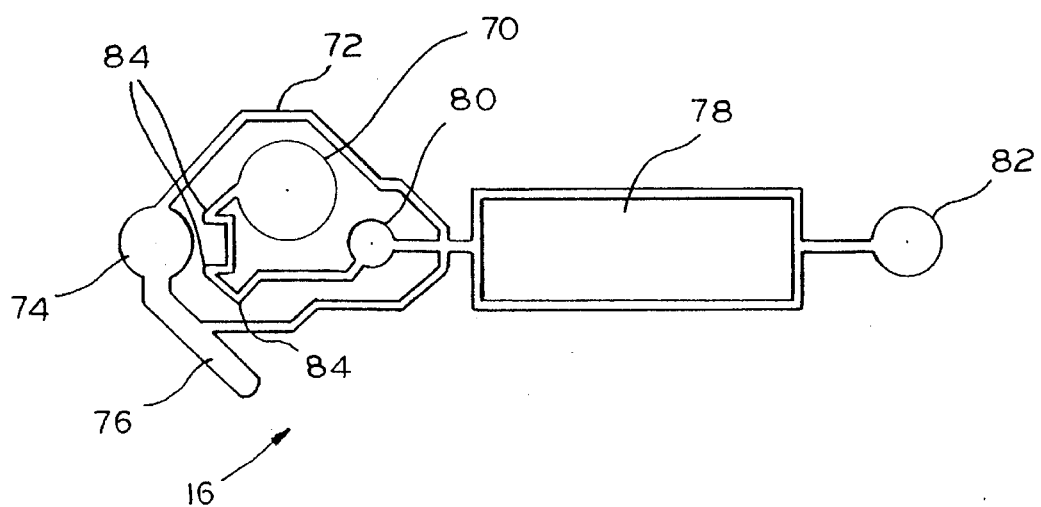
FIG. 5 is an enlarged circuit board layout for a portion of the circuit board in the switch of FIG. 1 for providing high voltage protection.

With reference to FIG. 5, an enlarged circuit illustrates a portion of the circuit elements on the circuit 16, see FIG. 1. Particularly, the circuit board 16 is provided with built-in spark protection and to provide static discharge to protect the circuitry from high voltage transients. The spark protection is used for connecting both the probe element and the guard shield via suitable conductors to the circuit board 16.

In the illustration, the copper tracks which are on the solder side of the printed circuit board are depicted in solid line, while the components installed thereon are depicted in phantom. A relatively large circular pad 70 is attached to an external connection from the probe 26. An elongated pattern line 72 surrounds the external connection pad 70 and is connected to a smaller circular pad 74 connected via a lead 76 to ground. Illustrated component 78 comprises the resistor R10, see FIG. 3, which is connected between opposite pads 80 and 82. The first pad 80 is contained within the ground pattern 72 and is connected via a track 82 to the enlarged pad 70. Specifically, the track 82 zig-zags and includes several elbows having distal points 84 separated from the ground pattern 72, and pad 74, by approximately 0.010 inches. With such sharp bends at these points 84, high voltage gradients are present, and in fact, since air fails as an insulator around 20,000 volts per inch, the voltage potential will not exceed approximately 200 volts due to the discharge of higher voltage from the points 84 to ground. At such instances, the air surrounding the points 84 momentarily ionizes and the spark is dissipated without damage to other circuits.

Although not shown, a similar circuit layout is provided for connecting the guard shield in the circuit.

Thus, in accordance with the invention, a point level switch is provided which provides improved phase protection, power supply stability and spark gap protection.

The disclosed embodiment of the invention is illustrative of the broad inventive concepts comprehended hereby.

I claim:

1. A capacitance point level switch comprising:
   a probe adapted to be disposed in a material containing vessel, such material having a capacitance value dependent on its level in the vessel;
   an oscillator circuit developing a periodic signal at a select frequency;
   a reference network driven by said oscillator and including a reference capacitance for developing a periodic reference signal at the select frequency and phase displaced responsive to said reference capacitance;
   a probe network driven by said oscillator and connected to said probe to include the capacitance of the material for developing a periodic probe signal at the select frequency and phase displaced responsive to capacitance of the material; and
   an output circuit connected to said reference network and said probe network for developing a discrete output assuming a first or a second state according to the relative phase displacement of said periodic reference signal and said periodic probe signal.

2. The capacitance point level switch of claim 1 wherein said select frequency varies as a function of said reference capacitance and said material capacitance.

3. The capacitance point level switch of claim 1 wherein said oscillator circuit develops a square wave signal.

4. The capacitance point level switch of claim 1 wherein each said reference network and probe network comprises an RC circuit driven by said oscillator circuit for developing a sawtooth type waveform.

5. The capacitance point level switch of claim 4 wherein said RC circuits utilize a common potentiometer and said potentiometer is adjustable to calibrate said networks to select a desired material level at which said discrete output changes state.

6. The capacitance point level switch of claim 4 wherein each said reference network and probe network further comprises a comparator connected to said RC circuit for comparing the sawtooth waveform to a reference to develop a square wave output at the select frequency and phase displaced relative to said periodic signal responsive to the capacitance of its associated said RC circuit.

7. The capacitance point level switch of claim 4 further comprising a latching circuit connected to said output circuit and said reference network including means for varying resistance of said reference network RC circuit to provide hysteresis according to the state of said discrete output.

8. The capacitance point level switch of claim 4 further comprising a resistor and a switch circuit driven by said output circuit for selectively connecting said resistor across said reference network RC circuit or bypassing said resistor to provide hysteresis according to the state of said discrete output.

9. The capacitance point level switch of claim 1 wherein said output circuit includes means for determining which of said phase displaced signals leads the other.

10. The capacitance point level switch of claim 1 wherein said output circuit includes a flip-flop circuit connected to said network circuits.

11. The capacitance point level switch of claim 1 wherein said output circuit includes means for delaying when said discrete output switches from the first state to the second state.

12. The capacitance point level switch of claim 1 wherein said output circuit includes means for delaying when said discrete output switches from the second state to the first state.

13. The capacitance point level switch of claim 1 wherein said output circuit includes first means for delaying when said discrete output switches from the first state to the second state, second means for delaying when said discrete output switches from the second state to the first state and selection means for selectively switching said first and second means into and out of operation in said output circuit.

14. The capacitance point level switch of claim 1 wherein said output circuit includes an anti-bounce circuit for preventing cycling of said discrete output.

15. The capacitance point level switch of claim 1 further comprising a protection circuit connected to said probe network including means for compensating said probe network for temperature changes.

\* \* \* \* \*